United States Patent [19]

Gupta

[11] 4,431,871

[45] Feb. 14, 1984

[54] SOLID STATE RELAY

[75] Inventor: Vinita Gupta, Menlo Park, Calif.

[73] Assignee: Northern Telecom Limited, Montreal, Canada

[21] Appl. No.: 341,266

[22] Filed: Jan. 21, 1982

[51] Int. Cl.³ .............. H03K 17/693; H04M 19/00
[52] U.S. Cl. .................. 179/84 A; 307/72; 307/584; 307/570; 307/304; 179/18 HB
[58] Field of Search .......... 179/84 A, 84 R, 18 HB, 179/18 FA, 16 AA; 307/2, 72, 244, 570, 584, 85, 571, 304

[56] References Cited

U.S. PATENT DOCUMENTS 3,602,738  8/1971  Bohm ........................ 307/304 X

OTHER PUBLICATIONS

*CMOS Cookbook*, D. Lancaster, 1977, p. 24.
Patent Abstracts of Japan, vol. 4, No. 141, Oct. 4th, 1980, p. 114E28 & JP-A-55-93322.

*Primary Examiner*—G. Z. Rubinson
*Assistant Examiner*—James L. Dwyer
*Attorney, Agent, or Firm*—Schwartz, Jeffery, Schwaab, Mack, Blumenthal & Kock

[57]  ABSTRACT

A solid state relay provides for a discontinuous transfer contact function. The solid state relay includes a first field effect transistor (FET) in a first switch, and second and third FETs in a second switch. The first and second FETs are each connected with AC responsive bias circuits for biasing the respective FETs into a non conductive condition. A control circuit operates the first and second switches to provide a transfer contact function. In a switching transition between a supply of a talking battery via the second switch, to a telephone line, to a supply of a ringing battery line via the first switch to the telephone line, the third FET is operated to increase impedance between the talking battery supply and the second FET, to permit AC voltage from the ringing battery supply to bias the second FET OFF.

3 Claims, 1 Drawing Figure

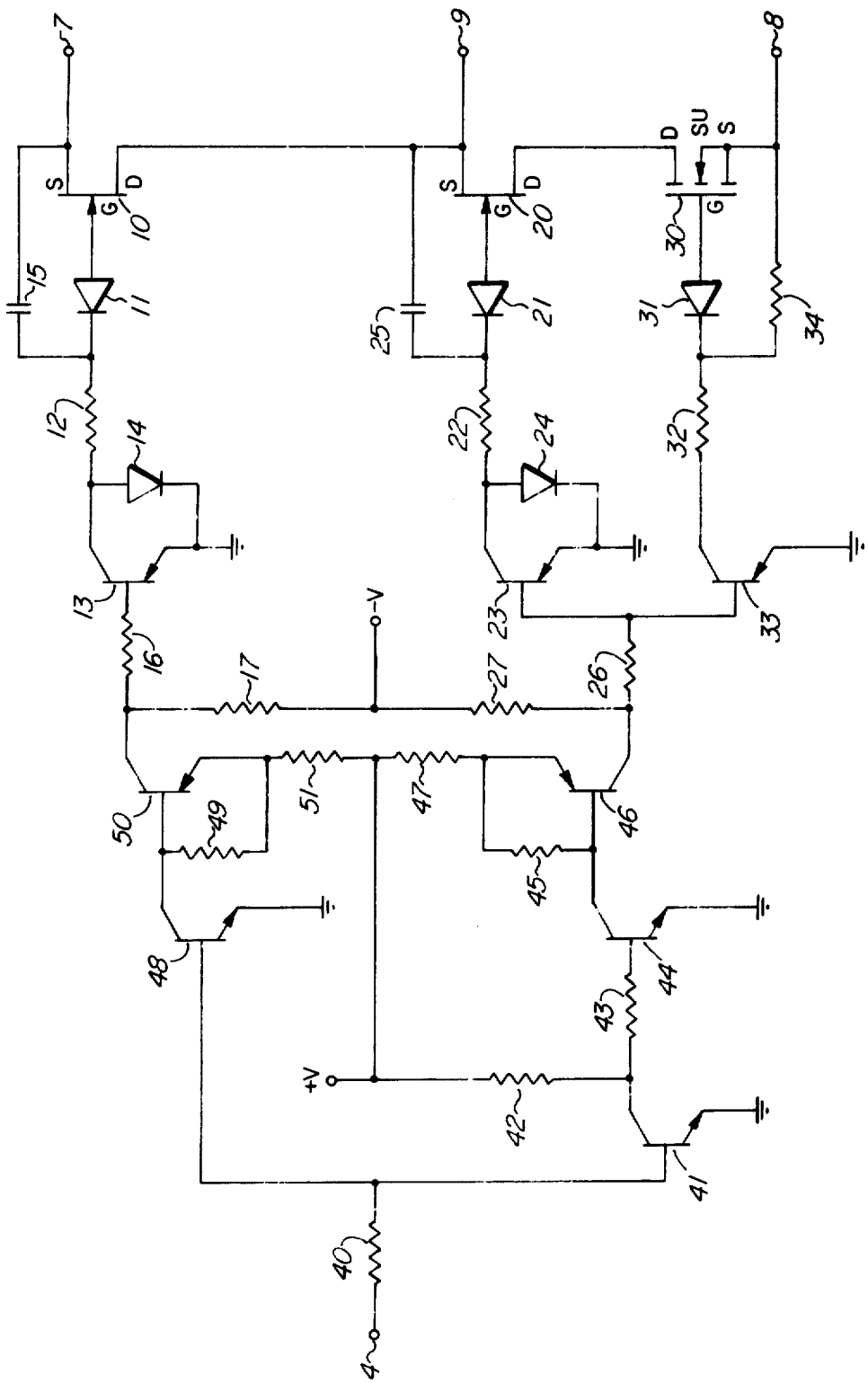

SOLID STATE RELAY

The invention is in the field of solid state switch circuits and more particularly relates to solid state relays for switching between a plurality of power sources.

In a telephone facility a telephone subscriber loop is typically coupled to the telephone facility by a line circuit. One of the functions of the line circuit is that of connecting the subscriber loop with one of at least two sources of energizing power. These sources of power are typically referred to as a talking battery and a ringing battery. The talking battery is a DC voltage source which is coupled to the subscriber loop on a continuous basis unless there is a requirement to signal an occurrence of a telephone call, whereupon the ringing battery is coupled to the loop. The talking battery is usually provided by a 48 volt DC supply and the ringing battery is usually provided by a 48 volt DC supply with about 80 volts of AC superimposed thereon.

With the passage of time telephone line circuits have tended to become more and more complex. This complexity has no doubt been necessitated by the growing popularity of digital switching and transmission facilities in telephone systems. As the bulk of this complexity is provided in the form of integrated silicon solid state circuits, the real manufacturing cost of a line circuit has not correspondingly increased and in some cases it has actually decreased. However the function of switching from one to another of energizing power sources for a subscriber loop in a typical telephone central office situation, remains in the realm of electro-mechanical relay devices.

The invention provides a solid state relay circuit which is useful in a telephone line circuit for coupling energizing power to the associated subscriber loop and which is economically advantageous when manufactured in an integrated circuit form.

A solid state relay in accordance with the invention comprises a first switch including a field effect transistor (FET) connected in series between a first terminal and a common terminal to provide a switchable current path therebetween. A second switch includes second and third FETs connected in series between the common terminal and a second terminal to provide a switchable current path therebetween. First and second outputs of a control circuit are connected to the first and second switches respectively. The control circuit is responsive to application of a control signal at a control input to provide a transfer contact function between the first, common, and second terminals via the first and second switches.

An example embodiment of a solid state relay is described in the following with reference to the accompanying drawing which is a schematic diagram of a solid state relay in accordance with the invention.

The solid state relay illustrated in the drawing provides a discontinuous transfer contact function. The solid state relay includes a first field effect transistor (FET) in a first switch and second and third FETs in a second switch. The first and second FETs are each connected with AC responsive bias circuits for biasing the respective FETs into a non conductive condition. A control circuit operates the first and second switches to provide a transfer contact function. In a switching transition between a supply of a talking battery via the second switch to a telephone line, to a supply of a ringing battery via the first switch to the telephone line, the third FET is operated to increase impedance between the talking battery supply and the second FET, to permit AC voltage from the ringing battery supply to bias the second FET OFF.

The solid state relay is suitable as an electronic substitution for an electromechanical relay having an operate coil and an associated transfer contact with make and brake switch members. A control terminal 4 provides for coupling of a control voltage to the solid state relay. First, second, and common terminals 7, 8 and 9, provide for coupling to switch members in the solid state relay. In one example where the solid state relay is used for alternately coupling one of a talking battery (not shown) and a ringing battery (not shown) to a telephone line (not shown), the terminal 7 is connected to the ringing battery, the terminal 8 is connected to the talking battery and the terminal 9 is connected to one side of the telephone line. Circuit elements 10 through 17 in combination provide a first switch function similar to that of one of the switch members in a transfer contact structure. Circuit elements 20 through 27 and 30 through 34 in combination provide a second switch function similar to that of the other of the switch members in a transfer contact structure. Circuit elements 40 through 51 provide in combination a control function similar to that of the operate coil, for controlling of the first and second switch functions.

The solid state relay is arranged to provide a first conduction path between the terminals 7 and 9 when a ground potential is applied at the control terminal 4. In this case the ground potential is coupled through a resistor 40 to bases of NPN transistors 41 and 48. The transistor 41, has a collector connected to a positive potential at a terminal $+V$ via a resistor 42 and being in a non conductive state, permits a current to flow via a base of an NPN transistor 44, a resistor 43 and the resistor 42. The transistor 44 is thus in a conductive state and conducts current from the terminal $+V$ to ground via resistors 47 and 45 to hold a base electrode of a PNP transistor 46 at about ground potential. An emitter electrode of the transistor 46 is connected to the junction of the resistors 47 and 45. As this junction is more positive than the base of the transistor 46, the transistor 46 conducts current between the terminal $+V$ and a negative potential at a terminal $-V$, causing its collector to be near ground potential. At the same time, the ground potential at the terminal 4 is supplied via the resistor 40 to a base of the NPN transistor 48. The transistor 48 is thus maintained in a non conductive state and permits a positive bias to be applied via resistors 51 and 49 at a base of a PNP transistor 50. A collector of the transistor 50 is connected via a resistor 17 to the terminal $-V$ and as the transistor is biased in a non conductive state, its collector is at a negative potential. In the case where the potential applied at the control terminal 4 is positive, the conduction states of the transistors 41, 44, 46, 48 and 50 are reversed. The collector of the transistor 46 becomes more negative and the collector of the transistor 50 approaches ground potential.

The solid state relay is arranged to provide a conductive path between the terminals 7 and 9 when the potential at the control terminal 4 is at or near ground potential. The potential at the collector of the transistor 50 is coupled through a resistor 16 to a base of a PNP transistor 13. An emitter of the transistor 13 is connected to ground. A diode 14 is connected, as shown, across the emitter and a collector of the transistor 13. The conductive path is provided through a field effect transistor 10 having source, drain and gate electrodes labelled S, D and G respectively. The FET 10 is connected as shown between the first and common terminals 7 and 9. The gate electrode of the FET 10 is connected in series with a diode 11 and resistor 12, which is connected to the collector electrode of the transistor 13. A capacitor 15 is connected between the terminal 7 and the junction between the resistor 12 and the diode 11. When the FET 10 is to be non conductive the transistor 13 is in a non conductive state, and only the diode 14 is conductive to limit positive signals to about ground potential. An AC voltage applied at the terminal 7 is coupled to a junction of the diode 11 and the resistor 12, however due to the action of the diode 14 and charging of the capacitor 15, the positive portions of the AC signal are clamped at about ground potential such that the instant potential of the AC voltage at the gate electrode of the FET 10 is always more negative than that at the source electrode of the FET 10. Under this condition the FET 10 exhibits a very high impedance between its source and drain electrodes. When on the other hand the transistor 13 is in a conductive state due to a negative potential at its base, the gate electrode of the FET 10 becomes at least as positive as its source electrode and the FET 10 then provides a very low impedance path between the terminals 7 and 9. This is arranged for by selecting the RC time constant of the capacitor 15 and the resistor 12 to be at least as long as the period of the lowest frequency AC signal to be passed by the FET 10.

The solid state relay is arranged to provide a conductive path between the terminals 8 and 9 when the potential at the control terminal 4 is positive. In this case the collector of the transistor 46 is negative and current flows from a base of a PNP transistor 23 via a resistor 26 and the resistor 27. Thus the transistor 23 is conductive and likewise a PNP transistor 33 is conductive. A diode 24 is connected, as shown, across an emitter and a collector of the transistor 23. A FET 20 includes source gate and drain electrodes labelled S, G and D, respectively. A resistor 22 and a diode 21 are connected in series between the gate electrode G of the FET 20 and the collector of the transistor 23, as shown. The source electrode S of the FET 20 is connected to the common terminal 9 and a capacitor 25 is connected between the common terminal 9 and the junction between the resistor 22 and the diode 21. The operation of the FET 20 is similar to the above described operation of the FET 10. When the transistor 23 is conductive, so is the FET 20. However in order to turn the FET 20 OFF, AC voltage is required for a turn off bias to be generated. If the drain electrode of the FET 20 were connected directly to the terminal 8, that is to the talking battery, the AC signal at the source electrode being supplied via the FET 10 would then be connected directly to AC ground through the FET 20. Hence there would be insufficient AC potential to bias the gate electrode, via the capacitor 25, to effect a turn OFF of the FET 20. To remedy this problem a FET 30, in this case an insulated gate FET is connected as shown, in series between the FET 20 and the terminal 8. The FET 30 includes source, gate, drain, and substrate electrodes labelled S, G, D and SU respectively. During normal desired conduction in the FET 20, the FET 30 is controlled via the PNP transistor 33, resistors 32 and 34 and a diode 31, connected as shown, to also be conductive. When the collector electrode of the transistor 46 approaches ground potential the transistors 23 and 33 both become non conductive. This causes the FET 30 to become non conductive for the talking battery potential, thus permitting sufficient AC signal to appear at the drain electrode of the FET 10 to cause the FET 20 to be turned off. When the FET 20 is turned off, the FET 10 supplies the ringing battery power to the common terminal 9, the AC component of the ringing battery power being effective to maintain a high impedance condition in the FET 20. The primary purpose of the FET 30 is to interrupt the conduction path between the talking battery and the common terminal 9 sufficiently for the FET 20 to become turned OFF.

What is claimed is:

1. A solid state relay comprising:

first, second, common and control terminals;

first switch means including a first field effect transistor (FET) connected in series between the first and common terminals to provide a switchable current path therebetween;

a second switch means including second and third FETs connected in series between the second and common terminals to provide a switchable current path therebetween;

a control circuit having first and second outputs connected to the first and second switch means and having an input connected to the control terminal, the control circuit being responsive to a control signal applied at the control terminal to cause in combination with the first and second switch means a transfer contact function between the first, common and second terminals;

the first and second FETS being each connected to an AC coupled bias circuit having a unidirectional conductive element connected to ground to provide a unidirectional termination such that the bias circuit is normally responsive to an AC signal to render the associated FET substantially nonconductive, and wherein the first and second outputs of the control means each include a transistor connected across the respective unidirectional conductive element for controllably altering the unidirectional terminal to a bidirectional termination to render the associated FET conductive.

2. A solid state relay being responsive to a control signal for providing a transfer switch function between a ringing battery terminal for connection to a ringing battery supply, a talking battery terminal for connection to a talking battery supply and a line terminal for connection to a telephone line, the solid state relay comprising:

a control circuit having an input port and first, second and third switch control ports, the control circuit being responsive to the control signal at the input port to cause the first switch control port to be unidirectionally conductive, the second switch control port to be bidirectionally conductive and the third switch control port to be unidirectionally conductive, and alternately to cause the first switch control port to be bidirectionally conductive, the second switch control port to be unidirectionally conductive and the third switch control port to be substantially non-conductive;

a first switch including a field effect transistor (FET) connected in series between the ringing battery terminal and the line terminal, a resistance being connected to the first switch control port and in series with a capacitance to the ringing battery terminal, and a unidirectional conductive device connected between a gate electrode of the FET and the junction of the resistance and the capacitance;

a second switch including a FET connected in series with the line terminal and the talking battery terminal, a resistance connected to the second switch control port and in series with a capacitance to the line terminal, and a unidirectional conductive device connected between a gate electrode of the FET and the junction of the resistance and the capacitance;

a third switch including a FET connected in series between the second switch and the talking battery terminal, a pair of resistances connected in series between the talking battery terminal and the third switch control port, and a unidirectional conductive device connected between a gate electrode of the FET and the junction between the pair of resistances.

3. A solid state relay comprising:

first, second, common and control terminals;

a first switch means including a first field effect transistor (FET) connected in series between the common and the first terminals and a first control circuit responsive to a first control signal being of one state for causing the first FET to have a low impedance and being responsive to an AC signal at the first terminal and to the first control signal being of the other state for causing the first FET to have a higher impedance;

a second switch means including a second FET connected to the common terminal and a third FED connected in series between the second FET and the second terminal, a second control circuit responsive to a second control signal being of one state for causing the second FET to have a low impedance and being responsive to an AC signal at the common terminal and to the second control signal being of the other state for causing the second FET to have a higher impedance, and a third control circuit responsive to the second control signal being of the one state for causing the third FET to have a low impedance and being responsive to the second control signal being of the other state to cause the third FET to have a higher impedance;

whereby during a transition of the first control signal to the one state and the second control signal to the other state, an AC current at the first terminal is sufficiently isolated from the second terminal by the third FET so as to have sufficient voltage at the common terminal to cause the second FET to exhibit the higher impedance state.

* * * * *